United States Patent
Egashira

(10) Patent No.: US 6,568,412 B2
(45) Date of Patent: May 27, 2003

(54) ROTARY PROCESSING APPARATUS WITH HOLDING BARS HAVING DRAIN GROOVES

(75) Inventor: Koji Egashira, Tosu (JP)

(73) Assignee: Tokyo Electron Limited, Tokyo-To (JP)

( * ) Notice: Subject to any disclaimer, the term of this patent is extended or adjusted under 35 U.S.C. 154(b) by 46 days.

(21) Appl. No.: 09/801,105

(22) Filed: Feb. 28, 2001

(65) Prior Publication Data
US 2002/0029852 A1 Mar. 14, 2002

(30) Foreign Application Priority Data

Feb. 28, 2000 (JP) ........................................ 2000-050749

(51) Int. Cl.⁷ .............................. B08B 3/00; B05C 13/02
(52) U.S. Cl. ........................ 134/159; 134/902; 118/500; 156/345.51
(58) Field of Search ................................ 134/157, 158, 134/159, 201, 902; 118/500; 156/345.11, 345.51

(56) References Cited

U.S. PATENT DOCUMENTS

| | | | | |
|---|---|---|---|---|
| 4,516,523 A | * | 5/1985 | Knox ........................... | 118/416 |
| 5,022,419 A | * | 6/1991 | Thompson et al. ......... | 134/102.1 |
| 5,672,212 A | * | 9/1997 | Manos ......................... | 134/1.3 |
| 5,727,582 A | * | 3/1998 | Terui ............................ | 134/140 |
| 6,318,389 B1 | * | 11/2001 | Schmidt et al. ............. | 118/500 |

* cited by examiner

Primary Examiner—Randy Gulakowski
Assistant Examiner—Joseph Perrin
(74) Attorney, Agent, or Firm—Smith, Gambrell & Russell, LLP

(57) ABSTRACT

A rotor (1) includes a pair of flanges (4, 5), four fixed holding bars (30) fixed to the flanges (4, 5), and two movable holding bars (60) supported for turning on the flanges (4, 5). The holding bars (30, 60) are provided in their surfaces with positioning grooves (32a) for positioning and holding wafers (W). The holding bars (30, 60) are provided with drain grooves (32b) connected to the positioning grooves (32a). The drain grooves (32b) prevent a processing liquid from staying in the positioning grooves (32a).

15 Claims, 12 Drawing Sheets

ROTARY PROCESSING APPARATUS WITH HOLDING BARS HAVING DRAIN GROOVES

BACKGROUND OF THE INVENTION

1. Field of the Invention

The present invention relates to a rotary processing apparatus for processing substrates, such as semiconductor wafers, by using a liquid, such as a chemical liquid or pure water.

2. Description of the Related Art

A known rotary processing apparatus of this kind is provided with a rotor for holding a plurality of disk-shaped substrates, such as semiconductor wafers, in a parallel arrangement. The rotor has a plurality of holding bars disposed around substrates and capable of being brought into contact with the circumferences of the wafers to hold the wafers on the rotor. Each holding bar is provided with positioning grooves in its parts to be brought into contact with wafers. Wafers can be securely held in the positioning grooves of the holding bars. The rotor holding substrates is rotated and the substrates are sprayed with a liquid, such as a chemical liquid or pure water, to remove completely particles, contaminants including organic contaminants, and residual pieces of a resist film and an oxide film to be completely removed from the wafers. The wafers can be dried by forcing the liquid to move radially outward by centrifugal force produced by rotating the rotor. However, it has been found that drying the wafers by rotating the rotor takes time because the liquid apt to stay in the positioning grooves of the holding bars.

SUMMARY OF THE INVENTION

The present invention has been made in view of the aforesaid problem and it is therefore an object of the present invention to provide a rotary processing apparatus that uses a liquid for processing substrates, capable of drying the substrates in a short drying time.

To achieve the objective, the present invention provides a rotary processing apparatus, which includes a rotor capable of rotation and provided with a plurality of holding bars that hold substrates, wherein each holding bar is provided with a plurality of positioning grooves to receive peripheral parts of the substrates when the holding bars hold the substrates, and each holding bar is also provided with drain passages that drain a liquid from the positioning grooves.

In the above apparatus according to the present invention, each drain passage may be a drain groove connected to the positioning groove and formed in a surface of the holding bar so as to extend away from an axis of rotation of the rotor.

The above apparatus according to the present invention may be configured so that: the rotor has a pair of flanges; the plurality of holding bars includes at least one fixed holding bar disposed between the pair of flanges and fixed to the flanges; the fixed holding bar has opposite threaded end parts penetrating through the flanges and projecting outside the flanges, respectively; the fixed holding bar is fixed to the flanges by screwing cap nuts on the threaded end parts of the fixed holding bar, respectively; and sealing members are disposed between bearing surfaces of the cap nuts and the corresponding flanges, respectively.

The above apparatus according to the present invention may also be configured so that: the rotor has a pair of flanges, between which the holding bars are arranged; one of the flanges is fastened to a rotor driving drive shaft disposed on the outer side of the one of the flanges with a bolt; the one of the flanges is provided with a counterbore to receive a head of the bolt; and the counterbore is tapered so that a diameter of an inner surface the counterbore becomes greater as the inner surface goes away from a bottom surface of the counterbore.

Furthermore, the rotary, according to the present invention al least one of the plurality of holding bars may be a movable holding bar, and the movable holding bar may be moved to enable the insertion of the substrates in a space surrounded by the plurality of holding bars.

DESCRIPTION OF THE PREFERRED EMBODIMENTS

Figure 1:
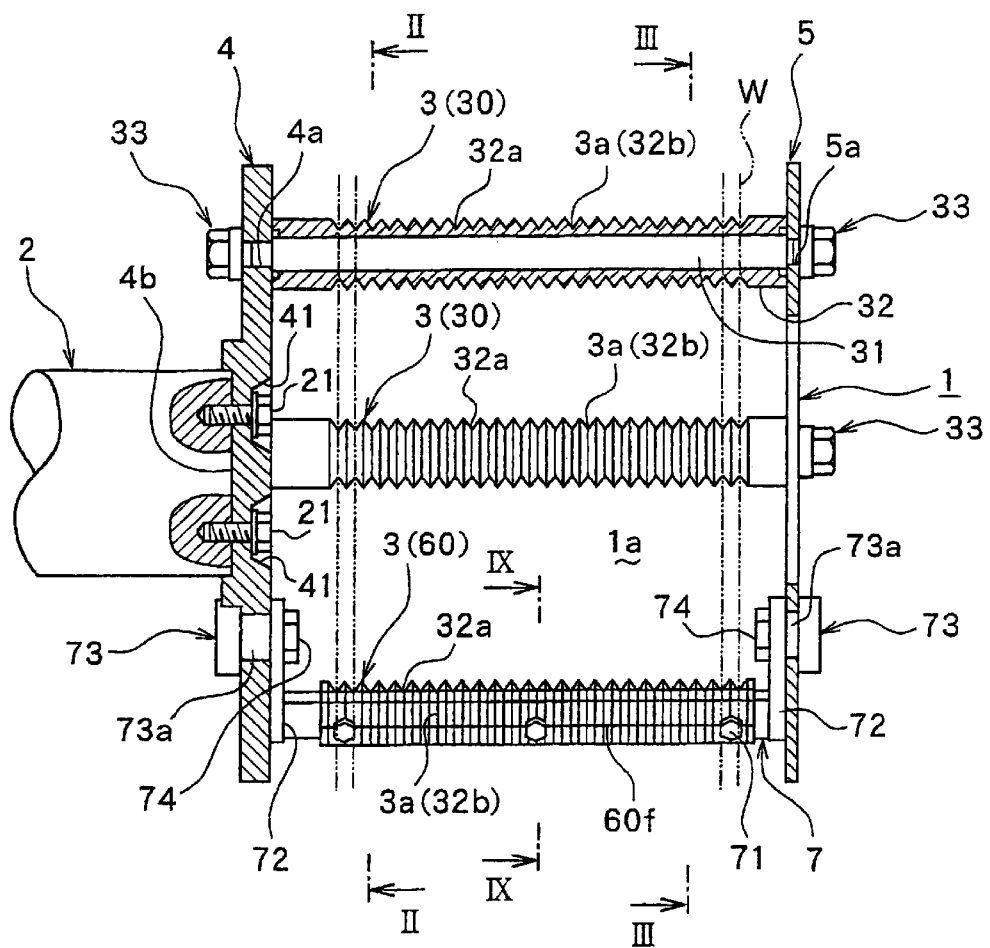
FIG. 1 is a fragmentary sectional view of a rotary processing apparatus in a preferred embodiment according to the present invention.

Preferred embodiments of the present invention will be described with reference to the accompanying drawings.

A rotary processing apparatus in a preferred embodiment according to the present invention is shown in FIGS. 1 to 9. The rotary processing apparatus has a rotor 1 that holds a plurality of disk-shaped wafers W (hereinafter referred to simply as "wafers W"), i.e., substrates, and rotates. The rotor 1 is provided with a plurality of holding bars 3 (six holding bars 3 in this embodiment), a first flange 4 having the shape of a disk and connected to one of the opposite ends of each holding bar 3, and a second flange 5 having the shape of a ring and connected to the other end of each holding bar 3.

The rotary processing apparatus has a processing vessel containing the rotor 1, a processing liquid supply system for supplying a processing liquid into the processing vessel and a drying fluid supply system for supplying a drying fluid into the processing vessel. The processing vessel, the processing liquid supply system and the drying fluid supply system will be described later.

The four holding bars among the six holding bars 3 are fixed holding bars 30 fixedly connected to the first flange 4 and the second flange 5, and the rest, i.e., the two holding bars 3, are movable holding bars 60. The four fixed holding bars 30 are disposed above a horizontal plane including the common center axis of wafers W and are arranged symmetrically with respect to a vertical plane including the common center axis of the wafers W. The two movable holding bars 60 as set at working positions for holding the wafers W are disposed below the horizontal plane including the common center axis of the wafers W and are arranged symmetrically with respect to the vertical plane including the common center axis of the wafers W.

When the two movable holding bars 60 are moved from their working positions away from each other, the wafers W can be carried into and taken out of a wafer holding space 1a in the rotor 1, surrounded by the holding bars 30 and 60. Only one of the holding bars 3 may be a movable holding bar 60 and the rest may be fixed holding bars; 30, provided that the wafers W can be carried into the wafer holding space 1a when the single movable holding bar 60 is shifted.

A plurality of positioning grooves 32a of a V-shaped cross section are formed in the surface of each of the fixed holding bars 30 and the movable holding bars 60 to hold the wafers W at proper positions on the rotor 1. As shown in FIG. 1, the positioning grooves 32a are arranged at equal intervals at corresponding axial positions on the fixed holding bars 30 and the movable holding bars 60 so that the plurality of wafers W may be held in a parallel arrangement on the rotor 1.

Each fixed holding bar 30 is provided with circumferentially-extending drain grooves 32 continuous with the positioning grooves 32a. In this embodiment, drain grooves 32b are connected to the opposite ends of the positioning grooves 32a and extend round the holding bar 3. A drain groove similar to the drain groove 32 is formed in the movable holding bar 60, which will be described later.

Figure 2:
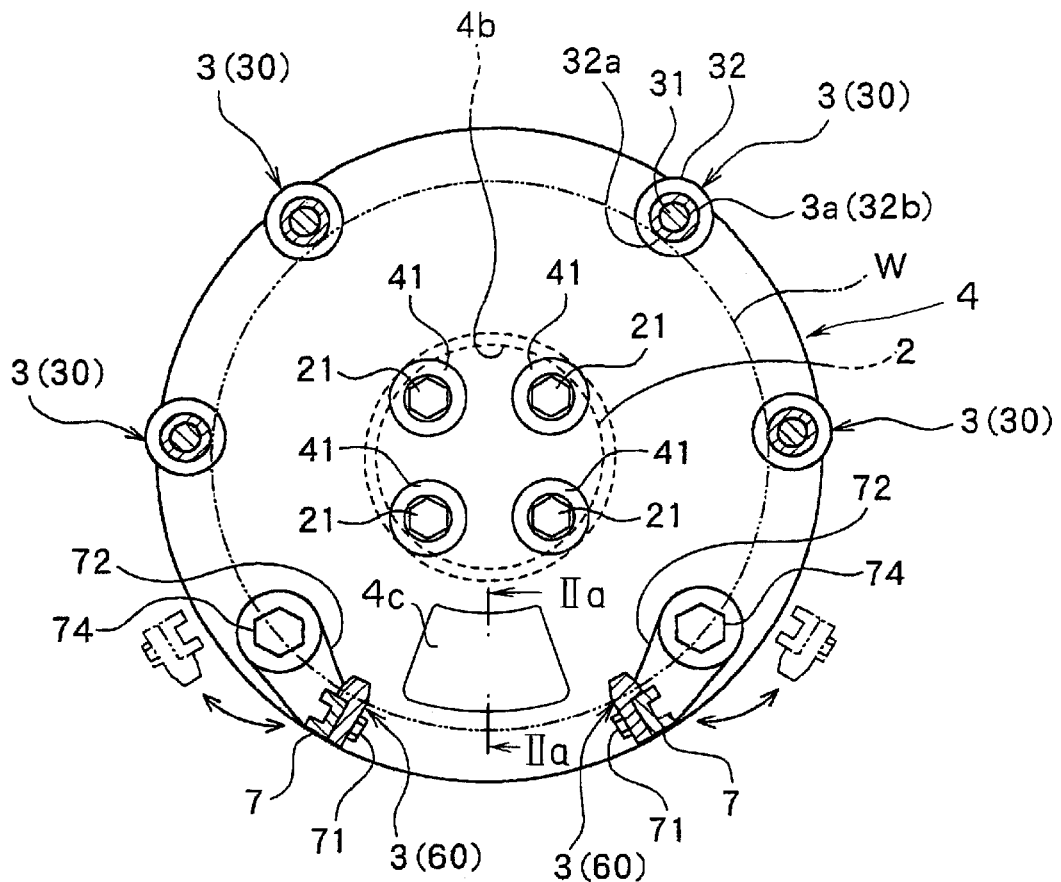
FIG. 2 is a sectional view taken on line II—II in FIG. 1.
Figure 2A:
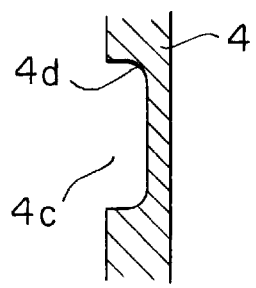
FIG. 2A is a sectional view taken on line IIa—IIa in FIG. 2.
Figure 6:
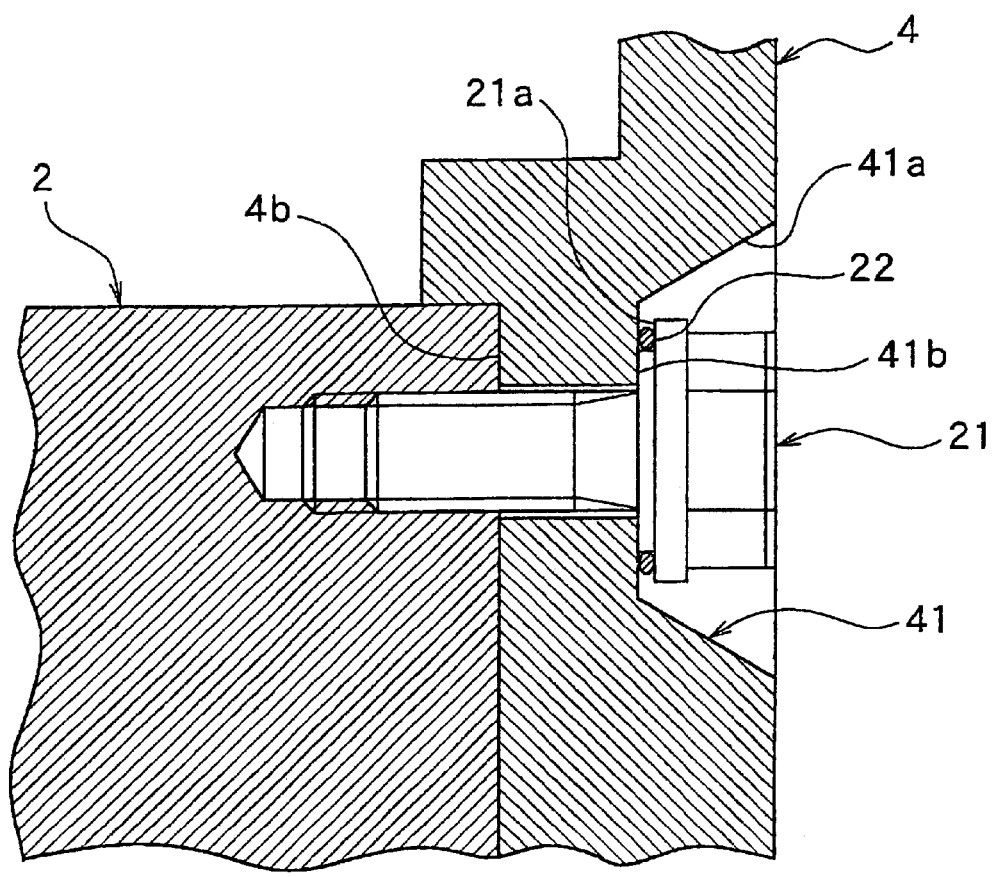
FIG. 6 is a sectional view of an essential part of a fastening structure for fastening a flange shown in FIG. 1 to a drive shaft.

Referring to FIGS. 1, 2 and 6, a circular recess 4b is formed in the outer side surface of the first flange 4 coaxially with the outer circumference of the first flange 4. A drive shaft 2 to be driven for rotation by a motor, not shown, is fitted in the recess 4b such that the end surface of the drive shaft 2 is in close contact with the bottom surface of the recess 4b. The first flange 4 is fastened to the drive shaft 2 with four flange fastening bolts 21 arranged at equal angular intervals on a circle having its center on the center of the recess 4b. Counterbores 41 are formed in the inner side surface of the first flange 4 such that the heads of the flange fastening bolts 21 sink in the counterbores 41. The side surfaces of the couriterbores 41 are tapered toward the bottom surfaces 41b of the counterbores 41, respectively. Sealing members 22 are held between the bottom surfaces 41b of the counterbores 41 and the heads of the flange fastening bolts 21, respectively, to prevent the penetration of a liquid into the threaded parts of the flange fastening bolts 21. An annular groove for receiving a sealing member, such as an O ring, may be formed in the side surface of the recess 4b or in the circumference of a part of the drive shaft 2 fitted in the recess 4b, and a sealing member may be placed in the annular groove to prevent the penetration of a liquid into the recess 4b. Preferably, the component members of the rotor 1 and the drive shaft 2 are formed of corrosion-resistant materials, such as stainless steels.

Figure 5:
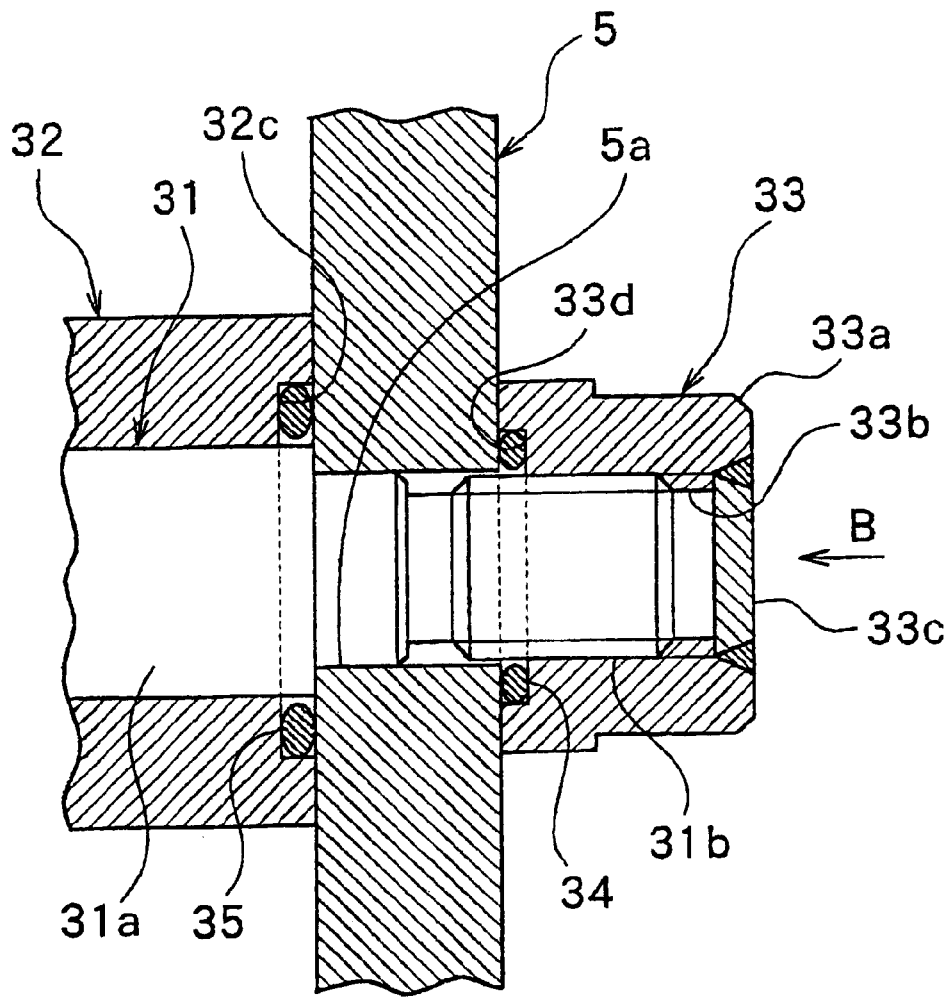
FIG. 5 is a sectional view of a cap nut shown in FIG. 1.

Referring to FIGS. 1 and 5, the first flange 4 and the second flange 5 are fastened to the opposite ends of the fixed holding bars 30, respectively. Each fixed holding bar 30 has a core member 31 of a circular cross section and a cylindrical shell member 32. The core member 31 is fitted in the shell member 32. The core member 31 has a middle main part 31a of a circular cross section and threaded end parts 31b of a diameter smaller than that of the main part 31a and extending from the opposite ends of the main part 31a, respectively. Through holes 4a and 5a of a diameter corresponding to that of the threaded end parts 31b are formed in the first flange 4 and the second flange 5, respectively. The through holes 4a and 5a have a diameter smaller than that of the main part 31a of the core member 31. The fixed holding bar 30 may be a single member integrally having a core part and a shell part.

The core member 31 of the fixed holding bar 30 is formed of a highly corrosion-resistant metal, such as a stainless steel, and the shell member 32 is formed of PTFE (polytetrafluoroethylene). The movable holding bars 60 are formed of PTFE. To hold the wafers W firmly without permitting any play during the rotation of the rotor 1, it is preferable to form the shell members 32 and the movable holding bars 60 of a properly elastic material or to coat the surfaces of the positioning grooves of the shell members 32 and the movable holding bars 60 with a properly elastic material.

Cap nuts 33 are screwed on the threaded end parts of the fixed holding bars 30 to fasten the fixed holding bars 30 to the first flange 4 and the second flange 5. Each cap nut 33 is formed by attaching a flat plate 33 to one end of a body 33a provided with a threaded hole 33b so as to close the threaded hole 33b. The flat plate 33c is welded hermetically to the body 33a. An annular recess for receiving a sealing member 34, such as an O ring, is formed in the bearing surface of the cap nut 33 so as to surround the threaded hole 33b.

Annular recesses 32c for holding sealing members 35, such as O rings, are formed in the opposite ends of the shell member 32 so as to surround the core member 31 fitted in the shell member 32.

The threaded end parts 31b of each holding bar 30 are inserted in the through holes 4a and 5a of the first flange 4 and the second flange 5, and the cap nuts 33 are screwed on the threaded end parts 31b to fasten the first flange 4 and the second flange 5 to the fixed holding bar 30. Thus, the first flange 4 and the second flange 5 are spaced a predetermined distance apart from each other and are firmly fastened to the fixed holding bars 30. The sealing members 34 seal gaps between the bearing surfaces of the cap nuts 33 and the outer side surfaces of the first flange 4 and the second flange 5 to prevent the penetration of a liquid into the threaded endparts 31b. The sealing members 35 seal gaps between the end surfaces of the fixed holding bars 30 and the inner side surfaces of the first flange 4 and the outer flange 5 to prevent the penetration of a liquid to the core member 31.

Only an attaching structure for attaching the second flange 5 to the fixed holding bar 30 is shown in FIG. 5. The same attaching structure applies to attaching the first flange 4 to the fixed holding bar 30.

A plurality of balancing recesses 4c for balancing the rotor 1 are formed in the side surfaces of the flanges 4 and 5 (only one balancing recess 4c formed in the first flange 4 is shown in the drawing). The bottom edge 4d of each balancing recess 4c is rounded to prevent a liquid from staying in the bottom edge 4d.

The movable holding bar 60, and an attaching structure for attaching the movable holding bar 60 to the flanges 4 and 5 will be described with reference to FIGS. 1 to 3, 8, 8A and 9.

Figure 8:
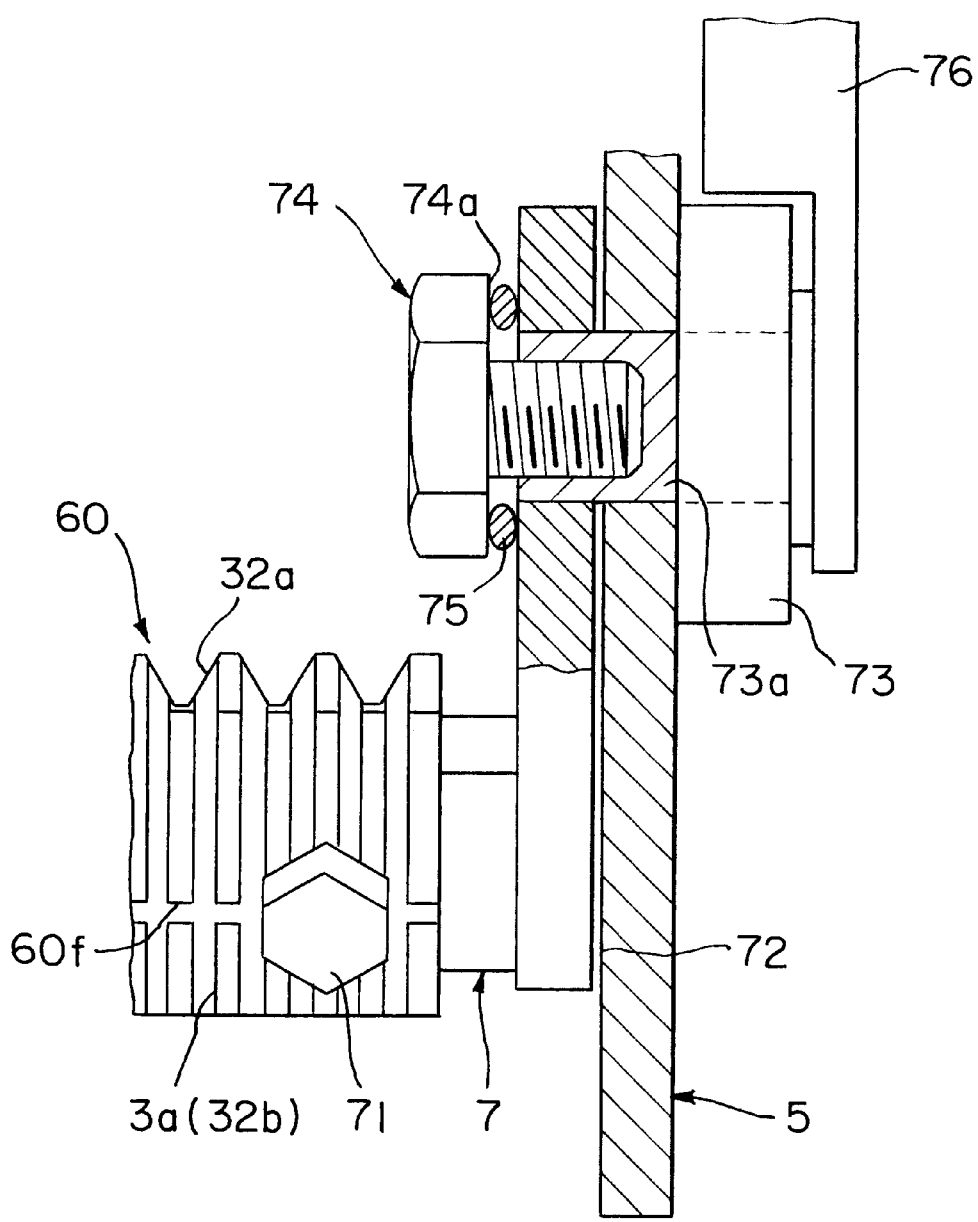
FIG. 8 is a sectional view of an essential part of a joining structure for joining a movable holding bar shown in FIG. 1 to a flange.

Referring to FIG. 8, a bearing 73 is attached to the outer side surface of the second flange 5 and a shaft 73a is supported in the bearing 73. An arm 72 has a base end part fastened to the inner end of the shaft 73a with a bolt 74. A sealing member, such as an O ring, is held between the bearing surface of the head of the bolt 74 and a side surface of the arm 72 to prevent the penetration of a liquid into the threaded end part of the bolt 74 and its vicinity. A stopper arm 76 is attached to the outer end of the shaft 73a. The shaft 73a can be turned by an operating means, not shown, disposed near the rotor 1.

A support member 7 for supporting the movable holding bar 60 is extended horizontally between the flanges 4 and 5. The support member 7 has opposite ends fixed to free end parts of the arms 72 supported respectively on the flanges 4 and 5. The movable holding bar 60 can be moved between a holding position (a position to hold wafers W) indicated by continuous lines in FIGS. 2 and 3 and a releasing position (a position to release wafers W and to enable wafers W to be carried into and taken out of the holding space 1a) indicated by two-dot chain lines by turning the shaft 73a.

Figure 3:
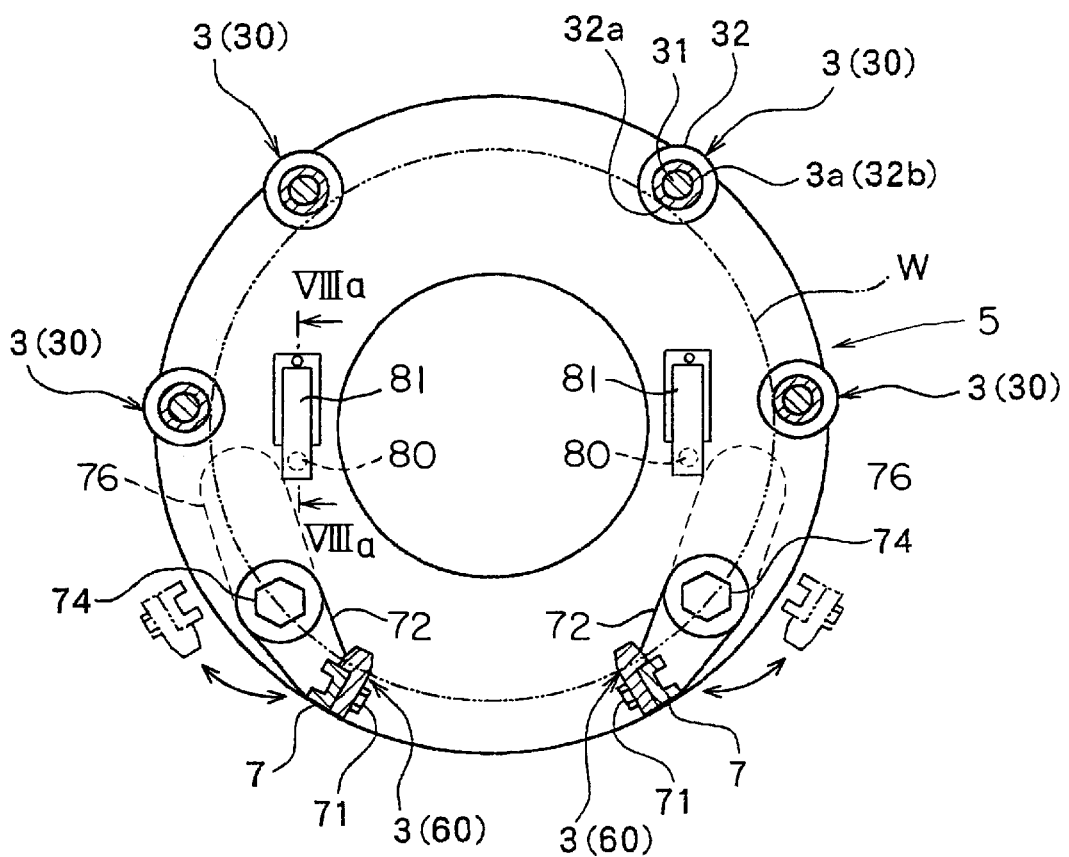
FIG. 3 is a sectional view taken on line III—III in FIG. 1.
Figure 4:
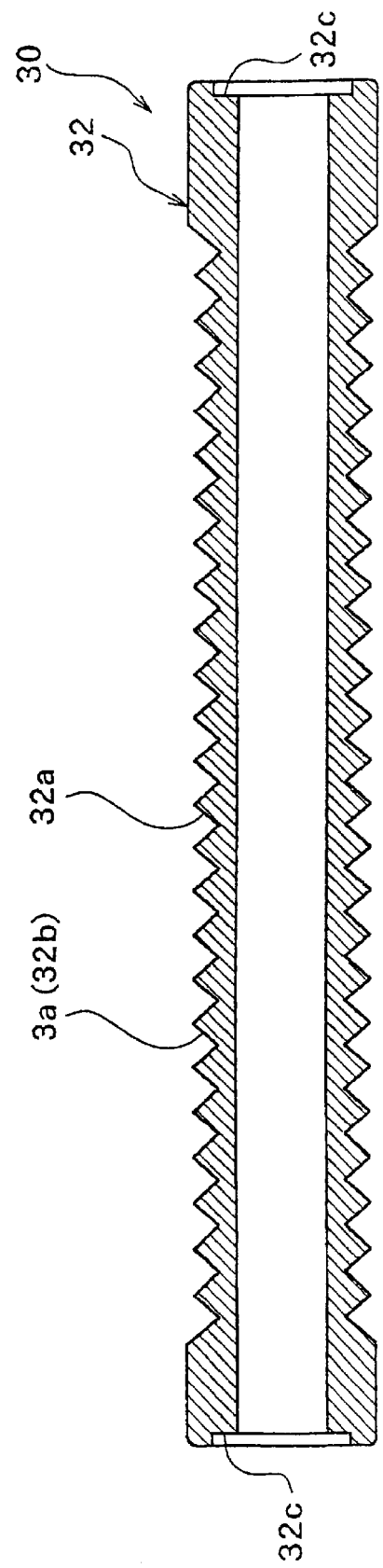
FIG. 4 is a sectional view showing a shell member of the fixed holding bar shown in FIG. 1.
Figure 8A:
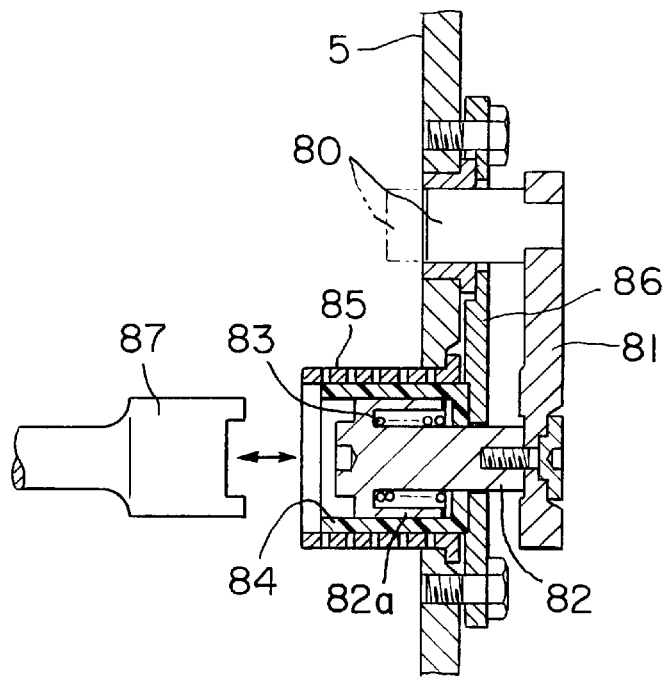
FIG. 8A is a sectional view of a stopping mechanism for stopping a movable holding bar.

As shown in FIGS. 3, 8 and 8A, the second flange 5 is provided with stopper mechanisms to restrain the movable holding bars 60 from being moved to the releasing position by centrifugal force while the rotor 1 is in rotation. The stopper mechanism includes the stopper arm 76 and a stopper pin 80 that engages the stopper arm 76 to restrain the stopper arm 76 from turning. As shown in FIG. 8A, the stopper pin 80 is connected to a shaft 82 provided with a flange 82a by a connecting plate 81. The flange 82a is slidable in a resin collar 84 fitted in a stainless steel collar 85. The stainless steel collar 85 is held fixedly on the second flange 5 by a holding plate 86. A spring 83 is extended in the flange 82a. In a state where any external force is not applied to the shaft 82, the stopper pin 80 is projected from the second flange 5 as indicated by two-dot chain lines in FIG. 8A to restrain the stopper arm 76 from turning, so that the movable holding bar 60 is prevented from being moved by centrifugal force. When the movable holding bar 60 needs to be moved to the releasing position, an axially movable push rod 87 supported near the rotor 1 so as to be movable toward and away from the rotor 1 is brought into engagement with the head of the shaft 82 and pushes the shaft 82 to shift the shaft 82 against the resilience of the spring 83. Consequently, a part of the stopper pin 80 projecting from the second flange 5 is retracted into the second flange 5 as indicated by continuous lines in FIG. 8A to permit the free turning of the stopper arm 76.

Figure 8B:
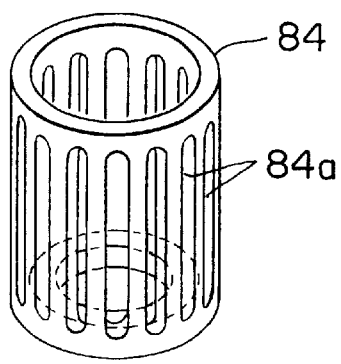
FIG. 8B is a perspective view of a resin collar shown in FIG. 8A.
Figure 8C:
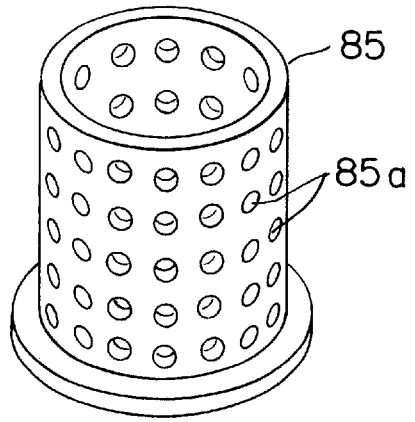
FIG. 8C is a perspective view of a stainless steel collar shown in FIG. 8A.

The resin collar 84 is provided with a plurality of longitudinal slots 84a as shown in FIG. 8B. The stainless steel collar 85 is provided with a plurality of through holes 85a as shown in FIG. 8C. The slots 84a and the through holes 85a prevents a liquid from staying between the collars 84 and 85 and between the flange 82a of the shaft 82 and the collar 85.

The movable holding bar 60 and the support member 7 and the combination of them will be described hereinafter.

Figure 9:
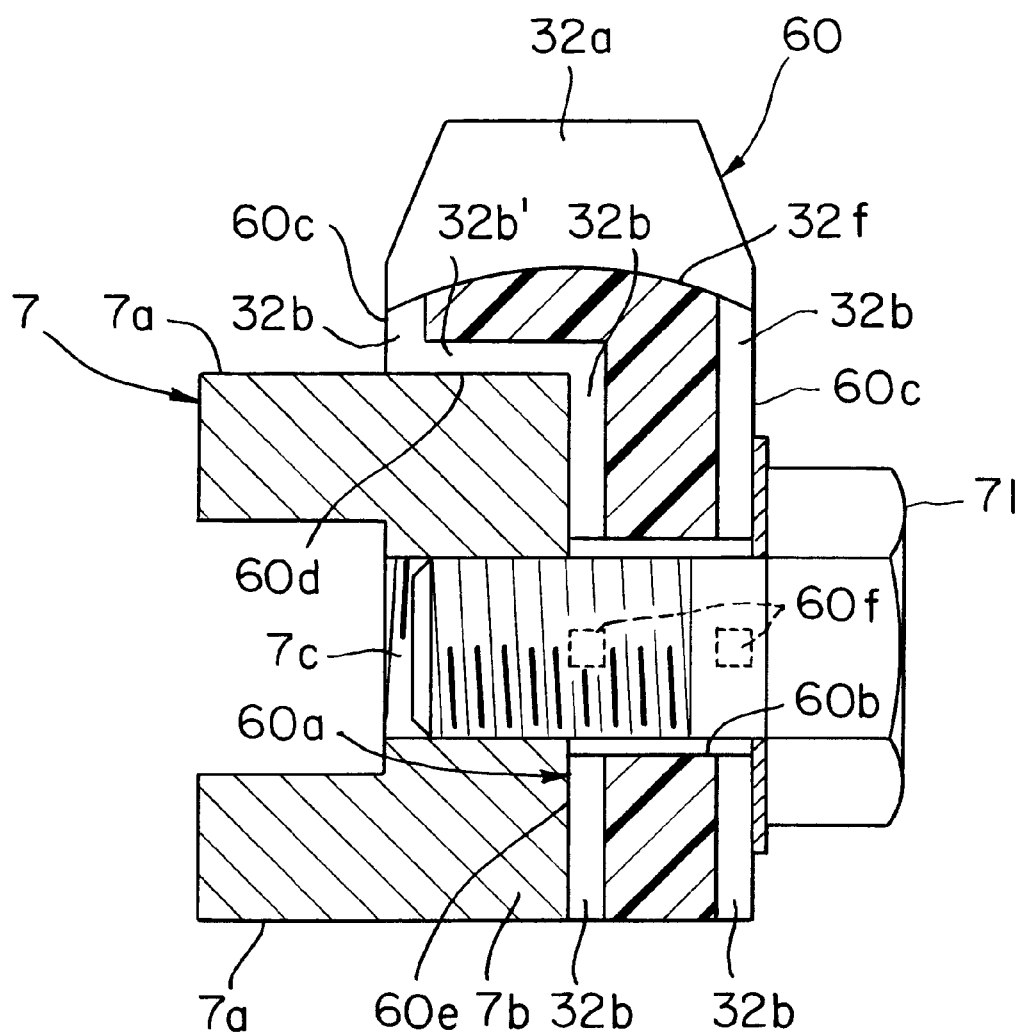
FIG. 9 is a sectional view taken on line IX—IX in FIG. 1.

Referring to FIGS. 2 and 9, the movable holding bar 60 has an L-shaped cross section. Through holes 62b are formed in a middle part and opposite end parts of the movable holding bar 60.

As best shown in FIG. 9, the support member 7 has a cross section resembling a square bracket and has web 7b and ribs 7a projecting from the web 7b. As shown in FIG. 2, the web 7b is directed toward the center axis of the rotor 1, i.e., the common center axis of the wafers W, when the movable holding bar 60 is set at the holding position indicated by continuous lines in FIG. 2. The web 7b of the support member 7 is provided with threaded holes 7c at positions corresponding to the through holes 60b of the movable holding bar 60.

As shown in FIG. 9, the web 7b of the support member 7 is fitted in a recess 60a formed in the movable holding bar 60. Bolts 71 are passed through the through holes 60b of the movable holding bar 60 and are screwed in the threaded holes 7c to fasten the movable holding bar 60 to the support member 7. Washers are placed between the bearing surfaces of heads of the bolts 71 and the movable holding bar 60.

Figure 7A:
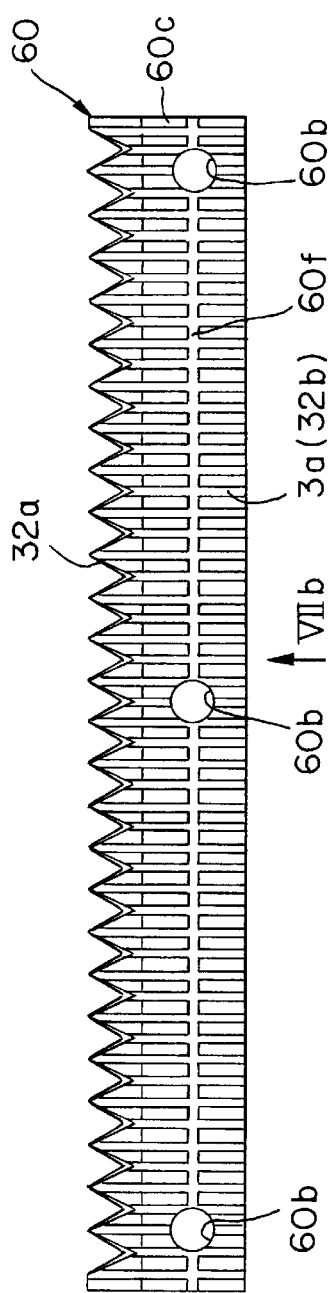
FIG. 7A is a front elevation of a movable holding bar shown in FIG. 1.
Figure 7B:
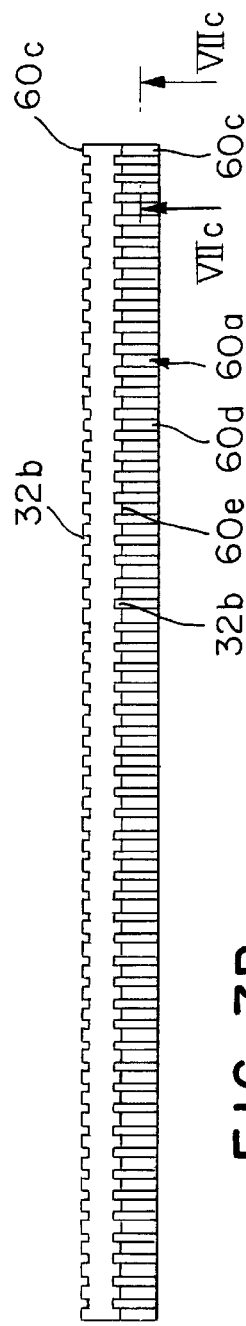
FIG. 7B is a view taken in the direction of the arrow VIIb in FIG. 7A.

As shown in FIGS. 7A and 9, the movable holding bar 60 is provided with V-shaped positioning grooves 32a. The positioning grooves 32a are arranged at equal intervals. The bottoms 32f of the positioning grooves 32a are curved so as to be convex toward the wafers W, i.e., upward as viewed in FIG. 9. Thus, the wafers W held by the movable holding bar 60 are in point contact with the surfaces of the positioning grooves 32a. The positioning grooves 32a directed toward the center axis of the rotor 1, i.e., in planes including the wafers, respectively.

The surface of the recess 60a of the movable holding bar 60 and the opposite side surfaces 60a of the movable holding bar 60 are provided with drain grooves 32b (32b') connected to the bottoms 32f of the positioning grooves 32a, respectively. The drain grooves 32b start from the positioning grooves 32a of the movable holding bar 60, extend continuously and terminate at an end of the movable holding bar 60 opposite an end in which the positioning grooves 32a are formed. As clearly shown in FIG. 9, the drain grooves 32b on the side of the recess 60a extend continuously along the side surface 60c, the surface 60d of the recess 60a and a surface 60e. The drain grooves 32b, excluding the drain groove 32b' formed in the surface 60d of the recess 60a, extend along radial lines extending from the center axis of the rotor 1 and extending along the surfaces of the wafers W held on the rotor 1. As shown in FIG. 7A, the drain groove 32b pass the centers of the through holes 60b and the opposite ends of the through holes 60b. Thus, the liquid staying in the through holes 60b can be easily drained. In the movable holding bar 60, the drain grooves 32b are narrower and shallower than the positioning grooves 32a.

Figure 7C:
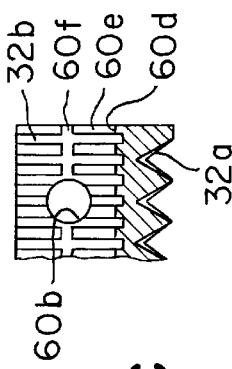
FIG. 7C is a sectional view taken on line VIIc—VIIc in FIG. 7B.

Referring to FIGS. 7A, 7C and 9, the movable holding bar 60 is further provided with connecting grooves 60f extending through the entire length of the movable holding bar 60 and crossing the drain grooves 32b so as to connect the drain grooves 32b. The connecting grooves 60f are formed in the surface 60e of the recess 60a and in a side surface 60c opposite the surface in which the recess 60a is formed, respectively. The connecting grooves 60f passes the centers of the through holes 60b. Although the connecting grooves 60f are formed in both the side surfaces of the movable holding bar 60, only one connecting groove 60f may be formed in the side surface of the movable holding bar 60 contiguous with the support member 7.

The drain grooves 32b and the connecting grooves 60f may be either V-grooves or U-grooves.

The advantageous effects stemming from the above-mentioned construction of the rotary processing apparatus will be explained hereinafter.

Since the drain grooves 32b are connected to the positioning grooves 32a, the liquid staying in the positioning groove 32a is drained quickly through the drain grooves 32b by centrifugal force when the rotor 1 rotates. Thus, the liquid is unable to stay in the positioning grooves 32a and hence the wafers W and the rotor 1 can be dried in a short time. When process using a chemical liquid is succeeded by a process using pure water, the chemical liquid remaining on the rotor 1 can be quickly replaced with pure water. Automatic spreading of the liquid staying in the positioning grooves 32a into the drain grooves 32b by a capillary action assists the flow of the liquid caused by centrifugal force.

In the fixed holding bars 30, drain grooves 32b are formed in the same sectional shape as that of the positioning grooves 32a. The drain grooves 32b of the fixed holding bars 30 are annular grooves; that is, the drain grooves 32b serve also as the positioning grooves 32a. Since the positioning grooves 32a are annular grooves, the fixed holding bars 30 can be fastened to the flanges 4 and 5 without paying any attention to the angular position of the fixed holding bars 30, which facilitate work for assembling the rotor 1 and the maintenance of the rotor 1. Since the bottoms of the positioning grooves 32a are arcs having their centers on the axis of the shell member 32, the wafers W can be set in point contact with the positioning grooves 32a even if the edges of the wafers W are straight. Therefore only a very small amount of the liquid is able to stay between the positioning grooves 32a and the wafers W. Since the bottoms 32f of the positioning grooves 32a of the movable holding bars 60 are convex toward the wafers W, only a very small amount of the liquid is able to stay between the positioning grooves 32a and the wafers W.

Since the sealing members 34 are held between the bearing surfaces of the cap nuts 33 and the flanges 4 and 5, respectively, the liquid is unable to penetrate into gaps between the cap nuts 33 and the threaded end parts of the fixed holding bars 30. Thus the cap nuts 33 and parts in the vicinity of the cap nuts 33 can be quickly dried.

Since the side surfaces 41a of the counterbores 41 are tapered toward the bottom surfaces 41b, respectively, a liquid flowed into the counterbores 41 are unable to stay in the counterbores 41 and flows immediately out of the counterbores 41. Thus, the interior of the counterbores 41 can be quickly dried up. Since the sealing members 22 are held between the bottom surfaces 41b of the counterbores 41 and the heads of the flange fastening bolts 21, respectively, the penetration of a liquid into the threaded parts of the flange fastening bolts 21 can be prevented. Thus, parts of the rotor 1 around the flange fastening bolts 21 can be quickly dried up.

The fixed holding bars 30 of a circular section have a large moment of inertia of area and are resistant to the bending action of reaction forces exerted thereto by the wafers W; that is, the fixed holding bars 30 have a high rigidity. Thus, the wafers W can be securely held on the rotor 1. Since each fixed holding bar 30 has the core member 31 and the shell member 32, the shell member 32 can be replaced with a new one simply by removing only the second flange 5 from the fixed holding bars 30, which facilitates the maintenance of the rotor 1.

Since the movable holding bars 60 are reinforced by the support members 7, respectively, the movable holding bars 60 are resistant to bending and are capable of securely holding the wafers W. Since the support members 7 have a substantially U-shaped cross section resembling a square bracket and the webs 7b are substantially perpendicular to peripheral parts of the wafers W held by the movable holding bars 60 on the rotor 1, the support members 7 have a very large moment of inertia of area when the movable holding bars 60 are set at the holding position. Thus the movable holding bars 60 remain straight under the bending action of the reaction force of the wafers W and hence the wafers W can be very securely held on the rotor 1. Although the movable holding bars 60 are provided with the recesses 60a, respectively, the movable holding bars 60 have a section having a big dimension in a direction perpendicular to the peripheral parts of the wafers W and hence the movable holding bars 60 have a high bending rigidity.

Since the movable holding bar 60 is provided in its surface 60e with the connecting groove 60f extending through the entire length of the movable holding bar 60, the area of contact between the movable holding bar 60 and the support member 7 is small. Thus, only a very small amount the liquid is able to stay between the movable holding bar 60 and the support member 7, the liquid can be quickly drained from the movable holding bar 60 and the movable holding bar 60 can be quickly dried.

Since the connecting groove 60f is connected to the drain grooves 32b and the through holes 60b, the liquid staying in the drain grooves 32b and the through holes 60b can be substantially evenly drained and hence the movable holding bar 60 can be quickly dried.

Even if the liquid penetrates into the threaded holes 7c, the liquid can be easily expelled from the threaded holes 7c by centrifugal force acting on the liquid when the rotor 1 rotates because the threaded holes 7c of the support member 7 in which the bolts 71 are screwed extend through the web 7b. Thus, the parts of the support member around the threaded holes 7c can be quickly dried.

Figure 10:
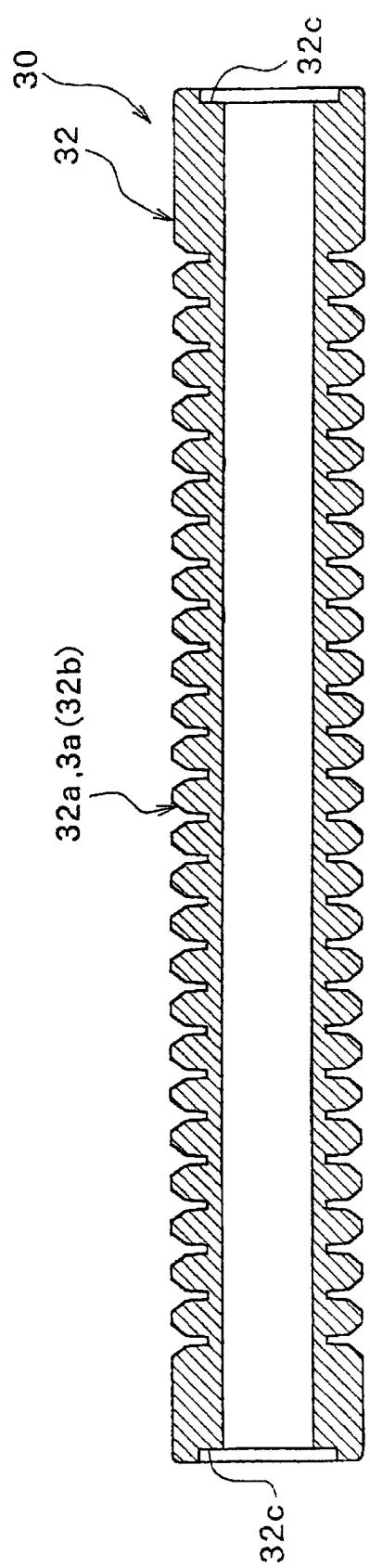
FIG. 10 is a sectional view of another possible shell for a rotary processing apparatus.

Although the positioning grooves 32a of the fixed holding bars 30 and the movable holding bars 60 have a V-shaped cross section in the aforesaid embodiment, the fixed holding bars 30 and the movable holding bars 60 may be provided with positioning grooves 32a of a Y-shaped cross section each having a wide outer section 32d and a narrow inner section 32e as shown in FIG. 10. The wafers W can be easily led into the Y-shaped positioning grooves 32a by the wide outer sections 32d and the wafer W can be securely held in place by the narrow inner sections 32e.

Therefore, if the rotor 1 is configured so that the rotor 1 is provided with the movable holding bars 60 positioned in a lower part of the rotor 1 and that the wafers W are inserted into the holding space 1a from below the rotor 1, it is preferable that the fixed, holding bars 30 having the Y-shaped positioning grooves 32a are disposed at left and right portions, respectively, within a lower area of the rotor and that the fixed holding bars 30 having the V-shaped positioning grooves 32a are disposed at left and right portions, respectively, within a upper area of the rotor. It is more preferable that the movable holding bars 60 are provided with the Y-shaped positioning grooves 32a.

A rotary processing apparatus 100 of the so-called double-chamber type provided with the aforesaid rotor 1 will be described hereinafter.

Figure 11:
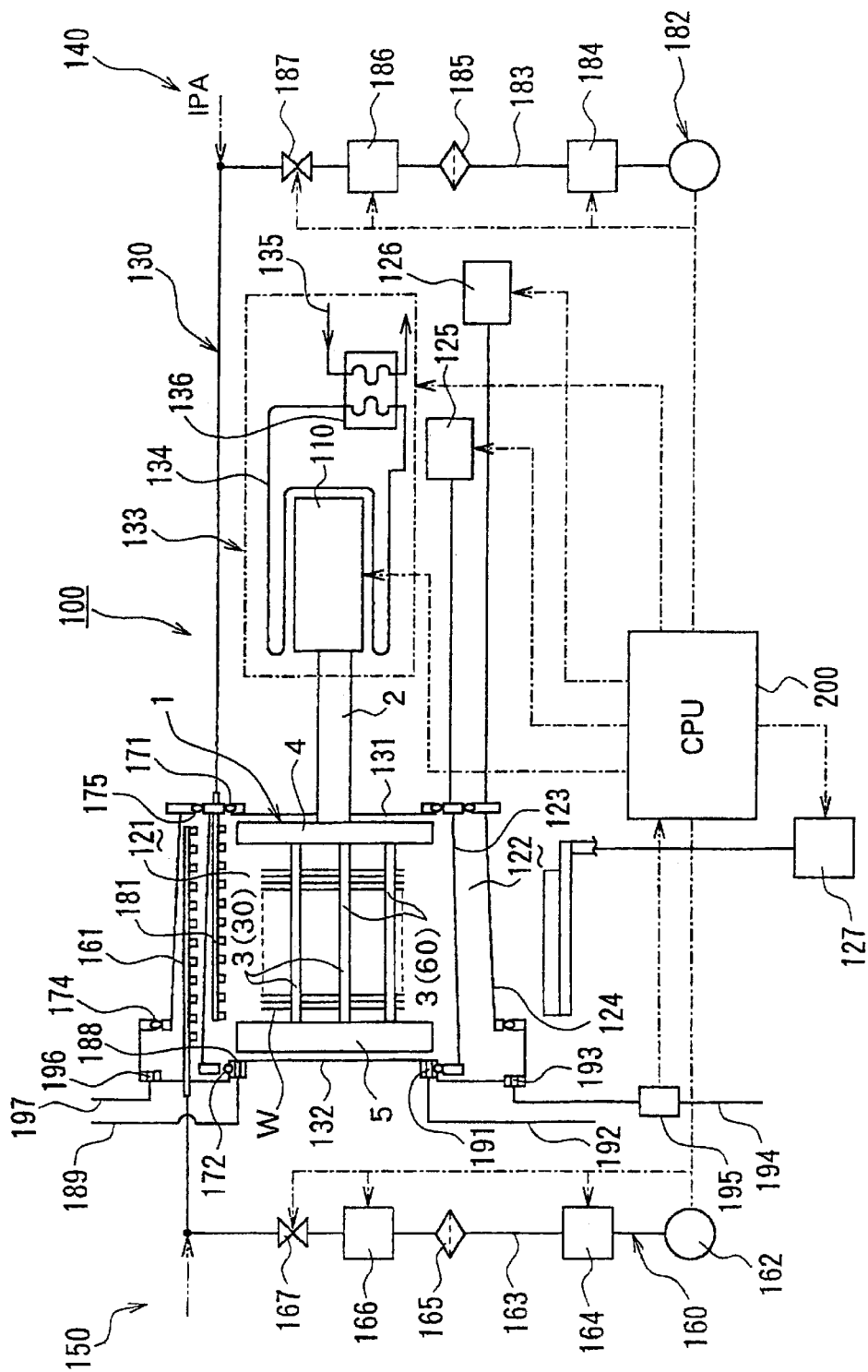
FIG. 11 is a diagrammatic view of a double-chamber liquid-assisted processing system employing a rotary processing apparatus according to the present invention.

As shown in Fig. 11, the rotary processing apparatus 100 includes, as principal components, the rotor 1, a motor 110 for driving the rotor 1 for rotation about a horizontal axis, an inner tube 123 that surrounds the rotor 1 holding wafers W to form a first processing chamber 121, an outer tube 124 that surrounds the rotor 1 holding wafers W to form a second processing chamber 122, a chemical liquid supply system 130 for supplying a processing liquid, for example, a chemical liquid, such as a resist removing liquid or a polymer removing liquid, into the first processing chamber 121 or the second processing chamber 122 to process the wafers W held on the rotor 1, a solvent supply system 140 for supplying a solvent for the chemical liquid, such as isopropyl alcohol (IPA), a rinsing liquid supply system 150 for supplying a rinsing liquid, such as pure water, a drying fluid supply system 160 for supplying a drying gas (drying fluid), for example, an inert gas, such as nitrogen gas ($N_2$), or clean air, a first cylinder actuator for moving the inner tube 123, a second cylinder actuator 126 for moving the outer tube 124, and a wafer transfer hand 127 for transferring wafers W between a wafer carrying device, not shown, and the rotor 1.

The motor 110, the fluid supply systems 130, 140, 150 and 160 and the wafer transfer hand 127 are controlled by a control unit, such as a central processing unit (CPU) 200.

The drive shaft 2 for driving the rotor 1 is supported for rotation in a bearing, not shown, on a first fixed wall 131. A labyrinth seal, not shown, contiguous with the bearing supporting the drive shaft 2 on the first fixed wall 131 prevents particles produced on the side of the motor 110 from entering the processing chamber.

The motor 110 is housed in a fixed tube, not shown, joined to the first fixed wall 131. The motor 110 is controlled on the basis of a program stored in the CPU 200 so as to repeat selectively a high-speed operation mode in which its output shaft rotates at a high rotating speed in the range of 100 to 3000 rpm and a low-speed operation mode in which the output shaft rotates at a low rotating speed in the range of 1 to 500 rpm. Although the rotating speed range for the low-speed operation mode and that for the high-speed operation mode overlap partly each other, the low rotating speed and the high rotating speed are determined according to the viscosity of the chemical liquid, and the same for a specific chemical liquid are different from each other. The low rotating speed is such a rotating speed lower than a rotating speed that is necessary for removing the chemical liquid from the wafers by centrifugal force. On the other hand, the high rotating speed is such a rotating speed higher than a rotating speed that allows the chemical liquid to stay on the wafers W for sufficient reaction.

The operating mode of the motor 110 is changed repeatedly between the high-speed operation mode and the low-speed operation mode and hence it is possible that the motor 110 overheats. The motor 110 is cooled by a cooling device 133 to prevent overheating. As shown in FIG. 1, the cooling device 133 includes a cooling pipe 134 for carrying a cooling medium, arranged around the motor 110, and a heat exchanger 136. A part of the cooling pipe 134 and a part of a cooling water pipe 135 are arranged in the heat exchanger 136. The cooling medium flowing through the cooling pipe 134 is cooled by cooling water flowing through the cooling water pipe 135.

The cooling medium is a liquid having an electrically insulating property and a satisfactory heat conducting property, such as ethylene glycol, so that electricity may not leak from the motor 110 increase the cooling medium leaks from the cooling pipe 134. The cooling device 133 is controlled by the CPU 200 so as to operate according to a signal provided by a temperature sensor that senses the temperature of the motor 110. The cooling device 133 does not need to be the foregoing construction; for example, the cooling device 133 may be of an air cooling system or an electrical system employing a Peltier element.

The inner tube 123 is formed of a stainless steel excellent in chemical resistance and strength. The stainless steel inner tube 123 may be coated with a fluorocarbon resin, such as PTFE or PFA. The inner tube 123 may be formed of a fluorocarbon resin, such as PTFE or PFA, which is desirable in improving the heat insulating property of the inner tube 123. The outer tube 124 may be formed of the same material as that forming the inner tube 123.

The inner tube 123 and the outer tube 124 have the shapes of truncated circular cones tapering toward base ends, respectively. The inner tube 123 and the outer tube 124 are substantially coaxial. The outer tube 124 is greater in diameter than the inner tube 123 and is capable of housing the inner tube 123 therein. The inner tube 123 and the outer tube thus formed can be installed in a narrow space and enable the construction of the system in a relatively small size.

The piston rod of the first cylinder actuator 125 is pushed out to move the inner tube 123 to a working position where the inner tube 123 surrounds the rotor 1. In this state, a base end part of the inner tube 123 is engages the first fixed wall 131, the gap between the base end part of the inner tube 123 and the first fixed wall 131 is sealed hermetically by a first sealing member 171, a free end part of the inner tube 123 is engages a second fixed wall 132 and the gap between the free end part of the inner tube 123 and the second fixed wall 132 is sealed hermetically by a second sealing member 172 to form a fist processing chamber 121.

The piston rod of the first cylinder actuator 125 is pulled back to move the inner tube 123 to a waiting position where the inner tube 123 surrounds the fixed tube. In this state, the free end part of the inner tube 123 engages the first fixed wall 131, the gap between the free end part of the inner tube 123 and the first fixed wall 131 is sealed hermetically by the first sealing member 171, the gap between the base end part of the inner tube 123 and a middle part of the fixed tube is sealed hermetically by a third sealing member, not shown, to prevent the leakage of the chemical liquid remaining in the inner tube 123 from the inner tube 123.

The piston rod of the second cylinder actuator 126 is pushed out to move the outer tube 124 to a working position where the outer tube 124 surrounds the rotor 1. In this state, a free end part of the outer tube engages the second fixed wall 132 and the gap between the free end part of the outer tube 124 and the second fixed wall 132 is sealed hermetically by a fourth sealing member 174. When the inner tube 123 is located at the working position, a base end part of the outer tube 124 engages the base end part of the inner tube 123 and the gap between the base end part of the outer tube 124 and the base end part of the inner tube 123 is sealed hermetically by a fifth sealing member 175. When the inner tube is located at the waiting position, the base end part of the outer tube 124 engages the free end part of the inner tube 123 and the gap between the base end part of the outer tube 124 and the free end part of the inner tube 123 is sealed hermetically by a fifth sealing member 175 to form a second processing chamber 122.

The piston rod of the cylinder actuator 126 is pulled back to move the outer tube 124 is moved to a waiting position where the outer tube 124 surrounds the fixed tube. When moving the outer tube 124 to the waiting position, the inner tube 123 is moved also to the waiting position. In this state, the fifth sealing member 175 is interposed between the base end part of the outer tube 124 and that of the inner tube 123. Therefore an atmosphere in the inner tube 123 and that in the outer tube 124 are isolated from each other, those atmospheres will not mix, so that cross contamination that is caused by the interaction of different processing fluids can be prevented.

Referring to FIG. 11, the chemical liquid supply system 130 includes a chemical liquid spraying unit 181, a chemical liquid source 182, a chemical liquid supply line 183 connecting the chemical liquid source 182 to the chemical liquid spraying unit 181 and provided with a pump 184, a filter 185, a temperature regulator 186 and a chemical liquid supply valve 187. The chemical liquid spraying unit 181 is attached to the inner tube 123 so as to be disposed in the first processing chamber 121. The chemical liquid spraying unit 181 includes a header pipe and a plurality of nozzles attached to the header pipe.

A first drain port 192 is formed in the second fixed wall 132 at a position corresponding to a lower part of the first processing chamber 121, and a first drain line 192 is connected to the first drain port 192. A circulating line, not shown is connected to a selector valve connected to the first drain line 192. The processing liquid drained through the first drain port 191 can be returned through the first drain line 192 and the circulating line to the chemical liquid supply unit 182 and can be supplied again through the chemical liquid spraying unity 181 into the first processing chamber 121. A first exhaust port 188 is formed in the second fixed wall 132 at a position corresponding to an upper part of the first processing chamber 121, a shut-off valve, not shown, is connected to the first exhaust port 188 and a first exhaust pipe 189 is connected to the shut-off valve.

A second drain port 193 is formed in the second fixed wall 132 at a position corresponding to a lower part of the second processing chamber 122, a shut-off valve, not shown, is connected to the second drain port 193 and a second drain line 194 is connected to the shut-off valve. The second drain line 194 is provided with a resistivity measuring device 195 for measuring the resistivity of pure water. The resistivity measuring device measures the resistivity of pure water used by a rinsing process and gives a signal representing a measured resistivity to the CPU 200. Thus, the condition of the rinsing process is monitored by using the signal provided by the resistivity measuring device 195. The rinsing process is ended upon the confirmation of the completion of the rinsing process from the signal provided by the resistivity measuring device 195.

A second exhaust port 196 is formed in the second fixed wall 132 corresponding to an upper part of the second processing chamber 122. A shut-off valve, not shown, is connected to the second exhaust port and a second exhaust line 197 is connected to the shut-off valve.

Referring to FIG. 11, the drying fluid supply system 160 includes a drying fluid jetting unit 161 attached to the second fixed wall 132, a drying fluid source 162 that supplies a drying fluid, such as nitrogen gas ($N_2$), and a drying fluid supply line 163 connecting the drying fluid source 162 to the drying fluid jetting unit 161 and provided with a shut-off valve 164, a filter 165 and a temperature regulator 166. The drying fluid jetting unit 161 includes a header pipe and a plurality of nozzles attached to the header pipe. A branch line, not shown, branched from an IPA supply line, not shown, is connected to the secondary side of the temperature regulator 166 placed in the drying fluid supply line 163.

The drying fluid jetting unit 161 is disposed so as to lie in an annular space between the inner tube 123 and the outer tube 122 when the inner tube 123 and the outer tube 124 are at their working positions. When the inner tube 123 is retracted to its waiting position and the outer tube 124 is moved to its working position to form the second processing chamber 122, the drying fluid jetting unit 161 lies inside the outer tube 124 to jet a mist of an $N_2$/IPA mixture against the wafers W. After drying the wafers W by the mist of a $N_2$/IPA mixture, the wafers W are dried further by using only nitrogen gas. The drying step using the mist of a $N_2$/IPA mixture may be omitted.

As mentioned above, the inner tube 123 and the outer tube 124 have the shapes of truncated circular cones tapering toward the base ends, respectively. Therefore, whirling currents produced by the rotating rotor 1 in the first processing chamber 121 or the second processing chamber 122 flow toward the free end of the inner tube 123 or the free end of the outer tube 123, carrying the mist of the chemical liquid toward the exhaust port 188 or 196, and the drain port 191 or 192. Thus, the chemical liquid can be efficiently drained from the first processing chamber 121 or the second processing chamber 122.

The chemical liquid supply system 130, the IPA supply system 140, the pump 184, the temperature regulators 186 and 166, the chemical liquid supply valve 187, the IPA supply valve, not shown, and the shut-off valve 167 of the pure water supply system 150 and the drying fluid supply system 160 are controlled by the CPU 200 (FIG. 11).

A series of operations for cleaning and drying of the rotary processing apparatus 100 will be briefly described hereinafter.

The wafer transfer hand 127 receives wafers from a wafer carrying device that carries wafers from a wafer receiving and delivering unit, not shown, or wafers from a wafer carrier. The movable holding bars 60 are moved to their open positions and the wafer transfer hand 127 is raided to carry the wafers W into the wafer holding space 1a in the rotor 1. Then, the movable holding bars 60 are moved to their holding positions to hold the wafers W on the rotor 1 by the fixed holding bars 30 and the movable holding bars 60. Locking mechanisms, not shown, are operated to lock the movable holding bars 60 at the holding positions. Subsequently, the wafer transfer hand 127 is retracted from the rotor 1 to its waiting position.

After the wafers W have been thus set on the rotor 1, the inner tube 123 and the outer tube 124 are moved to their working positions, so that the rotor 1 holding the wafers W is placed in the first processing chamber 121.

Then the wafers W are sprayed with a chemical liquid sprayed by the chemical liquid spraying unit 181 for a chemical treatment process The chemical treatment process repeats a chemical treatment step of spraying the chemical liquid for a predetermined time, such as several tens seconds, while the rotor 1 holding the wafers W is rotated at a low rotating speed in the range of, for example, 1 to 500 rpm, and a chemical liquid removing step of rotating the rotor 1 holding the wafer W for several seconds at a high rotating speed in the range of, for example, 100 to 3000 rpm several cycles or several thousands cycles. During a predetermined time after the start of the chemical treatment process, the chemical liquid supplied through the chemical liquid spraying unit 181 into the first processing chamber 121 is drained through the first drain port 191 and the first drain line 192, is circulated through the circulation line, not shown, and is supplied again through the chemical liquid spraying unit 181 into the first processing chamber 121. After the predetermined time has passed, only the new chemical liquid supplied from the chemical liquid source 182 is used for cleaning and then the chemical treatment process is completed.

Subsequently, a chemical liquid removing process for removing the chemical liquid from the wafers W is performed The chemical removing process has an IPA supply step and an IPA removing step.

In the IPA supply step, the rotor 1 holding the wafers W in the first processing chamber 121 is rotated at a low rotating speed in the range of, for example, 1 to 500 rpm and IPA is sprayed by the chemical liquid spraying unit 181 serving also as an IPA spraying unit for a predetermined time of, for example, several tens seconds. Then, the supply of IPA is stopped, and the IPA removing step is performed. In the IPA removing step, the rotor 1 holding the wafers W is rotated at a high rotating speed in the range of, for example, 100 to 3000 rpm for several seconds to remove residual IPA from the wafers W. The IPA supply step and the IPA removing step are repeated several or several thousands cycles to accomplish the chemical liquid removing process.

The chemical liquid removing process, similarly to the chemical treatment process, uses IPA stored in a circulation tank, not shown, in an initial stage of the chemical liquid removing process, throws away the IPA used in the initial stage of the chemical liquid removing process, and then uses IPA stored in a supply tank, not shown, and circulates the IPA. In a final stage of the chemical liquid removing process, new IPA supplied from the IPA source to the supply tank is used to complete the chemical liquid removing process.

Subsequently, the wafers are subjected to a rinsing process. The inner tube 123 is retracted to its waiting position. Consequently, the rotor 1 holding the wafers W is contained in the second processing chamber 122 defined only by the outer tube 124. The liquid that drips from the wafers W processed in the first processing chamber 121 is received by the outer tube 124.

Then the rotor 1 is rotated and the rinsing liquid supply system sprays the rotating wafers W with a rinsing liquid, such as pure water, by the ringing liquid spraying unit, not shown. The pure water used for rinsing and the IPA removed from the wafers W are drained through the second drain port 193 and the second drain line 194. Gases produced in the second processing chamber 122 are discharged through the second exhaust port 196 and the second exhaust line 197.

After performing the rinsing process for a predetermined time, the drying gas supply system blows a mixed fluid prepared by mixing nitrogen gas supplied from the $N_2$ gas source 162 and IPA supplied from an IPA source, not shown, against the wafers W rotating in the outer tube 122 to remove pure water from the wafers W. Thus, the wafers W and the second processing chamber 122 are dried. The wafers W and the second processing chamber 122 can be further efficiently dried by blowing only nitrogen gas against the wafers W after blowing the mixed fluid of nitrogen gas and IPA for the drying process.

After thus completing processing the wafers W by the chemical treatment process, the chemical liquid removing process, the rinsing process and the drying process, the outer tube 124 is retracted to its waiting position, where the outer tube 124 surrounds the inner tube 123 held at its waiting position. Subsequently, the wafer transfer hand 127 is raised to hold the wafers W held on the rotor 1. Then an unlocking mechanism, not shown, are operated, the movable holding bars 60 are moved to the open positions, and the wafer transfer hand 127 holding the wafers W is lowered to take out the wafers W from the rotor 1. The wafers W carried to a position below the rotor 1 are transferred to the wafer carrying device and are carried to the wafer receiving and delivering unit or the wafers W are put directly in a wafer carrier and the wafer carrier containing the wafers W is sent out from the rotary processing apparatus 100.

In the rotary processing apparatus 100, the liquid staying in the positioning grooves 32a are forced to flow through the drain grooves 32b by centrifugal force that acts on the liquid when the rotor 1 rotates. Since the liquid is unable to stay in the positioning grooves 32a, the wafers W and the rotor 1 can be quickly dried. The chemical liquid can be quickly replaced with pure water when the rinsing process is started after the chemical liquid removing process. The present invention is suitable particularly for the rotary processing apparatus 100 shown in FIG. 11 provided with the movable inner tube 123 and the movable outer tube 124, because the holding bars 30 and 60 need to be dried quickly.

The present invention is applicable to processing workpieces, such as LCD substrates and CDs, other than wafers.

What is claimed is:

1. A rotary processing apparatus comprising a rotor capable of rotation and provided with a plurality of holding bars that hold substrates,
   wherein:
      each holding bar is provided with a plurality of positioning grooves each configured to receive a peripheral part of each of the substrates when the holding bars hold the substrates;
      each holding bar is further provided with a plurality of draining grooves connected to the positioning grooves, respectively, to drain liquid from the position grooves, the draining grooves extending away from an axis of rotation of the rotor;
      said plurality of holding bars include a first holding bar; and
      said apparatus further includes a support member extending along the first holding bar, and the first holding bar is attached to the support member in such a manner that the draining grooves run between the first holding bar and the support member.

2. The apparatus according to claim 1, wherein:
   the rotor has a pair of flanges;
   the plurality of holding bars includes at least one fixed holding bar disposed between the pair of flanges and fixed to the flanges;
   the fixed holding bar has opposite threaded end parts penetrating through the flanges and projecting outside the flanges, respectively;
   the fixed holding bar is fixed to the flanges by screwing cap nuts on the threaded end parts of the fixed holding bar, respectively; and
   sealing members are disposed between bearing surfaces of the cap nuts and the corresponding flanges, respectively.

3. The apparatus according to claim 2, wherein the fixed holding bar includes a core member having opposite threaded end parts projecting from the flanges, respectively, and a cylindrical, shell member fitted on the core member and provided with the positioning grooves.

4. The apparatus according to claim 1, wherein:
   the rotor has a pair of flanges, between which the holding bars are arranged;
   one of the flanges is fastened to a rotor driving drive shaft disposed on the outer side of the one of the flanges with a bolt;
   the one of the flanges is provided with a counterbore to receive a head of the bolt; and
   the counterbore is tapered so that a diameter of an inner surface the counterbore becomes greater as the inner surface goes away from a bottom surface of the counterbore.

5. The apparatus according to claim 4, wherein a sealing member is disposed between a bearing surface of a head of the bolt and the bottom surface of the counterbore.

6. The apparatus according to claim 1, further comprising:

a first enclosing element adapted to surround the rotor to form a first processing chamber, in which the substrate is processed; and a second enclosing element adapted to surround the rotor to form a second processing chamber, in which the substrate is processed, the second enclosing element being capable of surrounding the first enclosing element.

7. The apparatus according to claim 6, wherein the first enclosing element and the second enclosing element are capable of moving relative to each other.

8. The apparatus according to claim 1, wherein the first holding bar is further provided with a connecting groove extending across the draining grooves and communicating the draining grooves with each other, and the connecting groove runs between the first holding bar and the support member.

9. The apparatus according to claim 1, wherein the first holding bar is attached to the support member by using a bolt, and the first holding bar has a threaded through-hole with which the bolt is engaged.

10. The apparatus according to claim 1, wherein the support member has a pair of ribs and a web connecting the pair of ribs, and has a cross section of a shape resembling a square bracket, and the web extends in a direction substantially perpendicular to circumferences of the substrates when the first holding bar engages peripheral parts of the substrates.

11. The apparatus according to claim 1, wherein a bottom of each of the position grooves is convex toward the axis of rotation of the rotor.

12. The apparatus according to claim 1, wherein:

said plurality of holding bars include a second holding bar having a circular cross section;

the positioning grooves and the drain grooves of the second holding bar are connected to each other, respectively, to form continuous annular grooves; and the first holding bar is movably attached to a body of the rotor, and the second holding bar is fixedly attached to the body of the rotor.

13. A rotary processing apparatus comprising:

a rotor capable of rotation and provided with a plurality of holding bars that hold substrates, wherein each holding bar is provided with a plurality of positioning grooves to receive peripheral parts of the substrates when the holding bars hold the substrates, each holding bar is also provided with drain passages that drain a liquid from the positioning grooves, and the plurality of holding bars include at least one movable holding bar which enables the substrates to be inserted in a space surrounded by the plurality of holding bars; and a support member fastened to the movable holding bar with a bolt, wherein the movable holding bar is provided with a connecting groove extending across and communicating the plurality of drain grooves with each other, and the connecting groove is provided at least in a part of the movable holding bar where the movable holding bar and the support member are in contact with each other.

14. The apparatus according to claim 13, wherein the support member is provided with a threaded through hole, with which the bolt is engaged.

15. The apparatus according to claim 13, wherein the support member has a pair of ribs and a web connecting the pair of ribs, and has a cross section of a shape resembling a square bracket, and the web extends in a direction substantially perpendicular to the circumferences of the substrates when the movable holding bar engages peripheral parts of the substrates.

* * * * *